United States Patent
Hudson

(12) 
(10) Patent No.: US 6,557,251 B2
(45) Date of Patent: May 6, 2003

(54) DIGITAL FEATURE SEPARATION

(75) Inventor: Edison T. Hudson, Chapel Hill, NC (US)

(73) Assignee: Infotech, A.G., Solothurn (CH)

( * ) Notice: Subject to any disclaimer, the term of this patent is extended or adjusted under 35 U.S.C. 154(b) by 84 days.

(21) Appl. No.: 09/802,406

(22) Filed: Mar. 9, 2001

(65) Prior Publication Data

US 2002/0006219 A1 Jan. 17, 2002

Related U.S. Application Data

(60) Provisional application No. 60/188,558, filed on Mar. 10, 2000.

(51) Int. Cl.$^7$ ................................................ H05K 3/30
(52) U.S. Cl. .................... 29/833; 29/407.04; 29/407.09; 29/720; 29/739; 382/152
(58) Field of Search ......................... 29/407.01, 407.04, 29/407.05, 407.09, 407.1, 702, 703, 720, 739, 743, 833; 382/151, 152; 702/34

(56) References Cited

U.S. PATENT DOCUMENTS

| | | | | |
|---|---|---|---|---|
| 3,610,508 A | 10/1971 | Laubmeyer | ..................... | 228/8 |
| 4,437,114 A | 3/1984 | LaRussa | ..................... | 358/101 |
| 4,613,942 A | 9/1986 | Chen | ..................... | 364/513 |
| 4,668,095 A | 5/1987 | Maeda | ..................... | 356/400 |
| 4,675,993 A | 6/1987 | Harada | ..................... | 29/740 |
| 4,818,993 A | 4/1989 | Stockel | ..................... | 340/825 |

(List continued on next page.)

FOREIGN PATENT DOCUMENTS

| | | | | |
|---|---|---|---|---|
| DK | 43 30 467 C 1 | 9/1993 | ............ | H05K/3/34 |
| DK | 42 16 242 A 1 | 11/1993 | ............ | G06F/13/10 |
| DK | 296 15 180 U 1 | 12/1996 | ......... | H03K/17/945 |

(List continued on next page.)

OTHER PUBLICATIONS

A copy of the International Search Report International App. No. PCT/US01/07586 META–007PCT is enclosed 8 pages.

(List continued on next page.)

Primary Examiner—Gregory M. Vidovich
Assistant Examiner—Jermie E. Cozart
(74) Attorney, Agent, or Firm—Thelen Reid & Priest LLP; David B. Ritchie

(57) ABSTRACT

A semiautomatic method for digital feature separation uses a trained sample selected by an operator using a software "eye dropper" tool or a similar region-of-interest tool to sample features of interest on a stored digital image of, for example, an electronic component such as pads, bumps or leads of the component. Pixels from the sampled features are analyzed and plotted based on their color hue and saturation values or gray scale intensity values. The range of such values is chosen by a user. A second digital image is then compared to the sampled feature data gathered by the "eye dropper" tool. If the color and intensity values of the pixels from the second digital image fall within a user defined acceptable absolute value range, then the locations and values of those pixels in the image are saved. Background or surrounding elements in the second digital image which do not fall within the acceptable value range are deleted and replaced with a code that makes these background or surrounding element locations appear as a graphic transparency. This process leaves only the features of interest in their original locations saved in the graphics memory surrounded by pixels that have been made video transparent. The resulting saved image which contains only the selected features is then laid over a live image such as that of a target substrate with corresponding features of interest. The operator then manually aligns the saved features from the component image over the corresponding features of the live image of the substrate to achieve component to substrate registration.

12 Claims, 5 Drawing Sheets

U.S. PATENT DOCUMENTS

| | | | | |
|---|---|---|---|---|
| 4,890,241 | A | | 12/1989 | Hoffman et al. ............ 364/513 |
| 4,911,543 | A | | 3/1990 | Hodgson ................... 350/508 |
| 5,081,336 | A | | 1/1992 | Schuster et al. ......... 219/85.16 |
| 5,195,234 | A | * | 3/1993 | Pine et al. .................... 29/720 |
| 5,452,201 | A | | 9/1995 | Pieronek et al. ............ 364/188 |
| 5,483,440 | A | | 1/1996 | Aono et al. ................. 364/167 |
| 5,576,946 | A | | 11/1996 | Bender et al. ............. 364/146 |
| 5,588,109 | A | | 12/1996 | Dickinson et al. .......... 395/326 |
| 5,768,759 | A | * | 6/1998 | Hudson ................... 29/407.04 |
| 5,787,577 | A | * | 8/1998 | Kent .......................... 29/833 |
| 5,805,442 | A | | 9/1998 | Crater et al. ................ 364/138 |
| 5,812,394 | A | | 9/1998 | Lewis et al. ................ 364/146 |
| 5,821,994 | A | | 10/1998 | Tani ........................... 348/207 |
| 5,903,662 | A | | 5/1999 | DeCarlo .................... 382/151 |
| 6,022,650 | A | * | 2/2000 | Sogawa ...................... 382/151 |
| 6,389,688 | B1 | * | 5/2002 | Srivastava et al. ............ 29/833 |

FOREIGN PATENT DOCUMENTS

| | | | |
|---|---|---|---|
| DK | 2 609 919 | 10/1997 | |
| DK | 196 42 737 A1 | 10/1997 | ........... B60R/16/02 |
| DK | 196 49 082 | 1/1998 | .............. B25J/3/04 |
| EP | 0 275 992 A2 | 1/1988 | ......... G05B/19/417 |
| EP | 0 449 481 A1 | 10/1991 | .......... H05K/13/04 |
| EP | 0 476 851 A2 | 3/1992 | .......... H05K/13/04 |
| EP | 0 777 263 A2 | 6/1997 | ........... H01L/21/00 |
| EP | 0 825 506 A2 | 2/1998 | ......... G05B/19/418 |
| EP | 0 932 103 A1 | 7/1999 | ........... G06F/13/10 |
| GB | 2 257 538 A | 1/1993 | ........... G05B/19/02 |
| WO | WO 89/04578 | 5/1989 | ............ H04Q/3/00 |
| WO | 91/19237 | 12/1991 | |
| WO | WO 95/30964 | 11/1995 | ............ G06K/9/00 |
| WO | WO 99/48276 | 9/1999 | ............ H04N/1/00 |
| WO | WO 00/04428 | 1/2000 | ......... G05B/19/042 |
| WO | WO 00/08588 | 2/2000 | |

OTHER PUBLICATIONS

A copy of the International Search Report International App. No.: PCT/US01/07587 META–003PCT is enclosed 4 pages.

A copy of the International Search Report International App. No.: PCT/US01/07236 META–004PCT is enclosed 4 pages.

A copy of the International Search Report International App. No.: PCT/IB01/00453 INFO–002PCT is enclosed 4 pages.

Patent Abstracts of Japan, Publication No. 11355625, Publication Date Dec. 24, 1999, App. No. 10158852, Inv. Kobayashi Tsutomu.

Smith, et al., "CyberCut: A World Wide Web Based Design–to–Fabrication Tool", pp. 432–442, Journal of Manufacturing Systems vol. 15/No. 6 1996.

A copy of the International Search Report International App. No. PCT/IB01/00450 INFO–006PCT is enclosed 5 pages.

A copy of the International Search Report International App. No.: PCT/IB01/00610 INFO–009PCT is enclosed 4 pages.

A copy of the International Search Report International App. No.: PCT/US01/07226 META–008PCT is enclosed 4 pages.

Halpert, et al, "Object Oriented Programming for Motion Control", Conference Record of 1991 Forty–Third Annual Conference of Electrical Engineering Problems in the Rubber and Plastics Industries; Apr. 15 & 16, 1991; pp. 58–68.

\* cited by examiner

DIGITAL FEATURE SEPARATION

RELATED APPLICATIONS

This application claims the benefit of provisional U.S. patent application Ser. No. 60/188,558 filed on Mar. 10, 2000 in the name of Edison T. Hudson and commonly assigned herewith.

FIELD OF THE INVENTION

The present invention is relates to machine vision systems for relative positioning of a component and a substrate for accurate semi-automatic placement of the component at a selected location on the substrate. While the specific examples discussed herein relate largely to the electronics assembly industry, the components placed may be electronic, electro-optic, electro-mechanical, optical, mechanical, micro-electronic machine (MEMS) devices, biological material, and the like, and may be of any size.

BACKGROUND OF THE INVENTION

Robotic assembly equipment is well known in the art. Such equipment includes, for example, pick and place (or placement) machines. A placement machine is a robotic instrument for picking up electronic and similar parts from component feeders and placing them at their assigned locations on a printed circuit board (PCB). Once all parts are placed, the PCB is placed in a reflow oven and solder paste disposed on the PCB melts or "reflows" forming permanent electrical connections between conductive pads on the PCB and electrical contacts, leads or "pins" on the electrical components.

Occasionally there are problems with the permanent electrical connections. For example, two pads of the PCB may become inadvertently bridged by solder, forming a short; the component may be mis-located; the component may prove faulty; and the like. In these situations, it is often economically desirable to salvage the partially assembled PCB rather than to scrap it. In order to salvage the PCB, one must remove the faulty component, re-prepare the PCB surface, and place and solder a new component (or a cleaned component) in the correct position on the PCB. This process is termed "rework". Reworking thus involves reflowing the solder of an identified target component (and not that of the entire PCB), removing the faulty component; cleaning and refluxing the PCB in the location where the component is to be mounted, reinstalling the component and reflowing the solder for the component.

In the past, most known rework systems operate almost entirely manually, i.e., a skilled operator, using an optical magnification system which views both the PCB top surface and the component bottom surface, manually aligns the PCB and the component for placement. Placement systems, on the other hand, typically employ machine vision systems to automate this process. However, most known systems utilize a pair of imagers. One imager views the top surface of the PCB to obtain PCB alignment information by imaging known reference points on the PCB (known in the art as "fiducials") and/or by imaging contact pads on the PCB, another imager views the component, its bottom and/or its sides, to determine component alignment information. Since skilled operators are relatively expensive to train and employ, it would be desirable to employ a semi-automatic machine vision solution to assist an operator in performing placement and rework functions placement and rework equipment.

BRIEF DESCRIPTION OF THE INVENTION

A semiautomatic method for digital feature separation uses a trained sample selected by an operator using a software "eye dropper" tool or a similar region-of-interest tool to sample features of interest on a stored digital image of, for example, an electronic component such as pads, bumps or leads of the component. Pixels from the sampled features are analyzed and plotted based on their color hue and saturation values or gray scale intensity values. The range of such values is chosen by a user. A second digital image is then compared to the sampled feature data gathered by the "eye dropper" tool. If the color and intensity values of the pixels from the second digital image fall within a user defined acceptable absolute value range, then the locations and values of those pixels in the image are saved. Background or surrounding elements in the second digital image which do not fall within the acceptable value range are deleted and replaced with a code that makes these background or surrounding element locations appear as a graphic transparency. This process leaves only the features of interest in their original locations saved in the graphics memory surrounded by pixels that have been made video transparent. The resulting saved image which contains only the selected features is then laid over a live image such as that of a target substrate with corresponding features of interest. The operator then manually aligns the saved features from the component image over the corresponding features of the live image of the substrate to achieve component to substrate registration.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
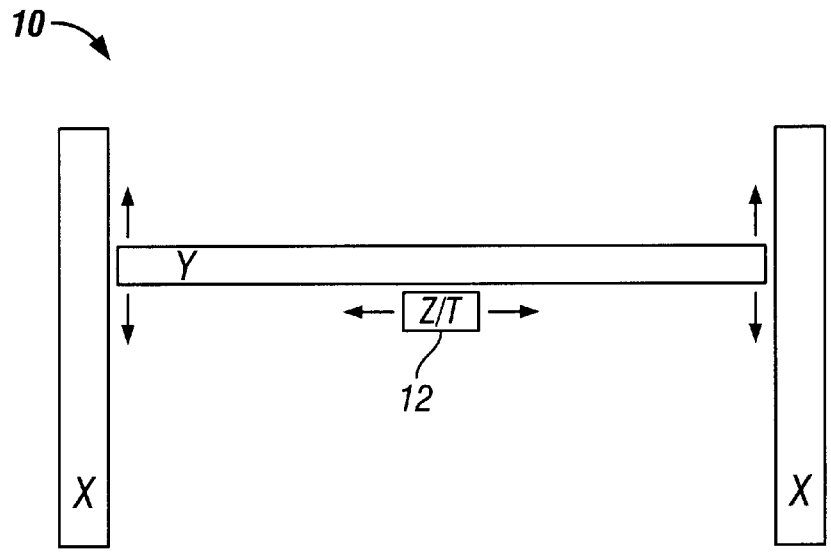
FIG. 1 is a system block diagram of an X, Y, Z, T positioning system in accordance with the prior art.

Embodiments of the present invention are described herein in the context of digital feature separation. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, certain components, process steps, and/or data structures may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

In the automation industry robots are widely used to perform processes on components. Any type of robot can be used with the present invention. For example, a single linear axis robot, a Scara robot and a Cartesian X/Y system may all be used, as can other systems designed to position a component relative to a substrate with a given positional accuracy.

In most cases, a robot is equipped with a Z-axis, carrying a tool. Often the tool may be rotated about the Z-axis in the T direction which is normally specified by an angle. At the tool various nozzles or grippers can be mounted to perform processes on attached components. The invention, by way of example and not limitation, can be used in the: electronics industry for SMT (surface mount technology) placement and repair, component assembly, printed circuit board (PCB) assembly, test and reflow; semiconductor industry for chip assembly including flip chip, micro-BGA (ball grid array) and balling; optics/photonics industry for micro-optics assembly, optics handling, optical elements packaging; mechanics industry for micro-assembly, material handling and component packaging; biotechnology industry for pharmaceutical production, liquid handling applications, genetic screening, assay handling and research applications.

Turning now to FIG. 1, a system block diagram of a placement machine 10 is illustrated. The placement machine 10 positions a Z/T stage 12 in the X and Y (horizontal) directions by moving the Z/T stage 12 along positional axis Y and moving positional axis Y between rails X which define the X-axis. Such systems are well known to those of ordinary skill in the art and can be built to various positional resolution accuracies, that is, if one wants to position a particularly sized object held by the Z/T stage to within a given range of distance, say +/−20 microns, those of ordinary skill in the art know how to build such systems.

Figure 2:
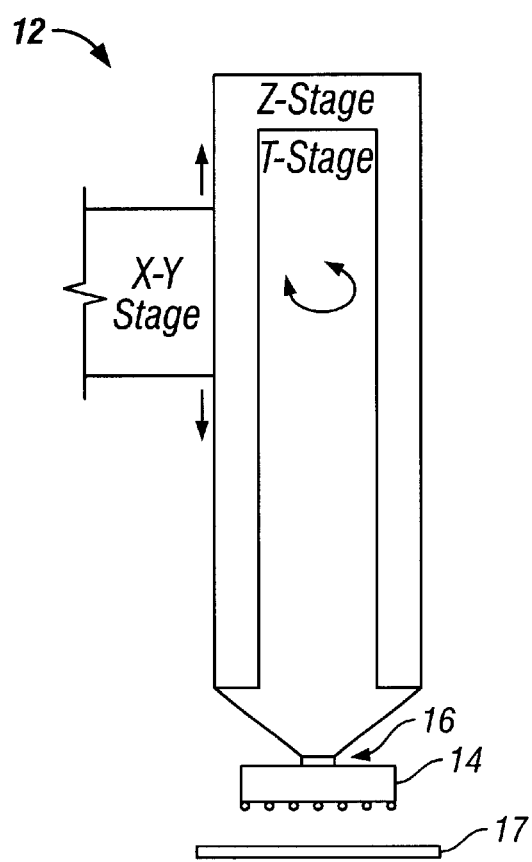
FIG. 2 is a schematic diagram of a Z/T positioning stage of an X, Y, Z, T positioning system in accordance with the prior art.

Turning now to FIG. 2, a schematic diagram of a Z/T positioning stage 12 of an X, Y, Z, T positioning system in accordance with the prior art is shown. The Z/T positioning stage holds a component 14 with a gripper 16 which can be a mechanical gripper, a vacuum gripper nozzle, or the like. The Z-stage includes a motor or actuator to position the stage along the vertical axis and over the substrate 17. The T-stage includes a motor or actuator to rotationally position the component. Thus, the X-Y stages position a component over a selected location of a substrate, the T-stage adjusts the orientation of the component for rotational position, and the Z-stage allows the component to be raised and lowered and, ultimately allows the component to be placed down on the substrate at a position within the positional resolution accuracy of the X-Y stage. Such systems, as discussed before, are well within the skill of those of ordinary skill in the art.

Figure 3:
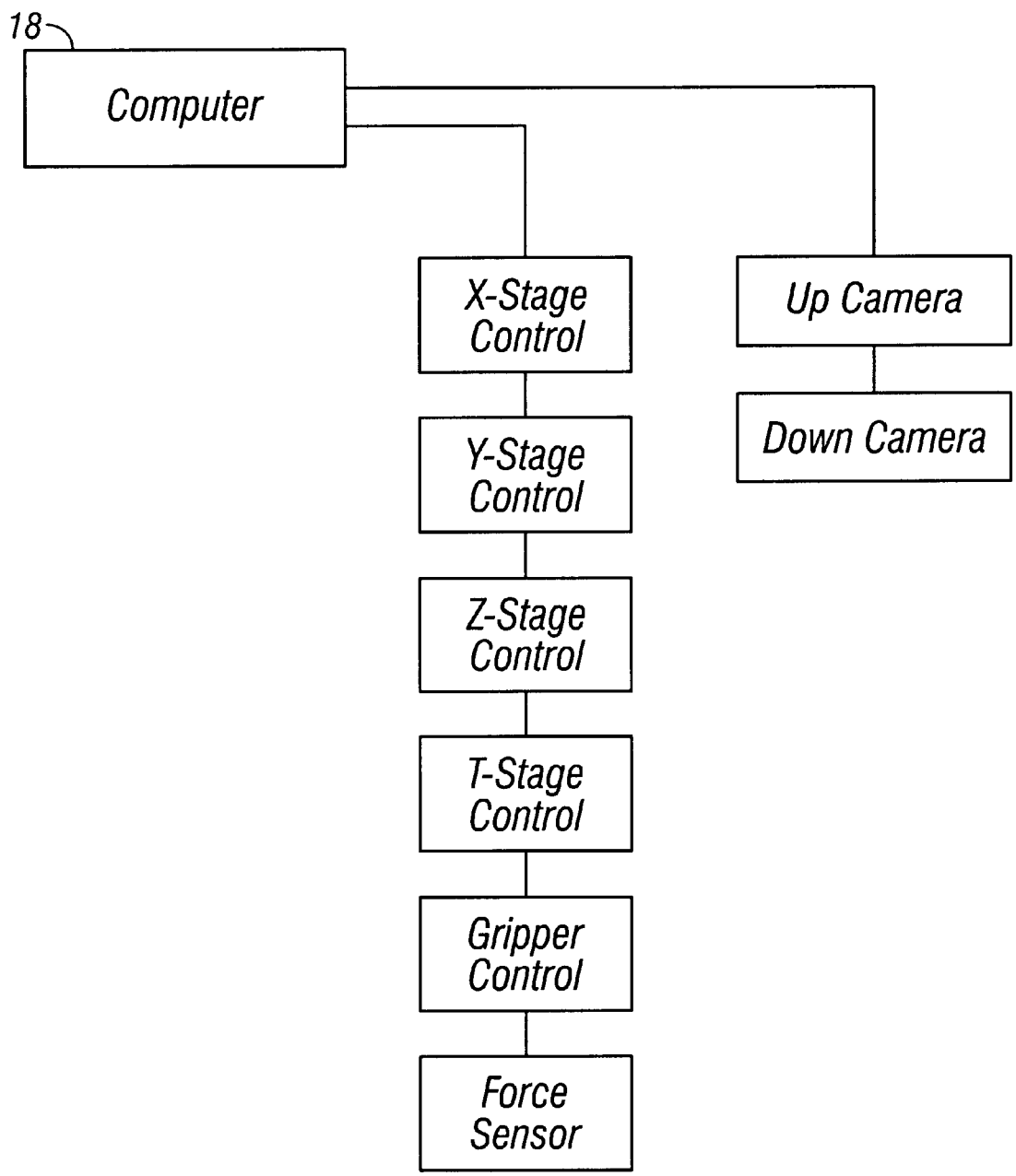
FIG. 3 is a system block diagram of a computer control system for an X, Y, Z, T positioning system in accordance with the prior art.

Turning now to FIG. 3, a system block diagram of a computer control system for an X, Y, Z, T positioning system in accordance with the prior art is shown. Such systems include a computer 18 that may be of any suitable type, such as a microprocessor, digital signal processor, and the like. Computer 18 may be distributed among several locations or located at a central site. Computer 18 receives inputs from position detectors associated with the various stages and provides outputs to actuators controlling the various stages. It also controls the component pick-up gripper and reads an output from a force sensor, if present, to determine the amount of force being applied to the pick-up head in compression against the substrate. Computer 18 (or a separate system in communication with computer 18) also reads inputs from one or more machine vision system cameras (or similar devices) that image the component and the substrate to assist in accurate placement of a component to the substrate. Generally such systems include a camera mounted on the bed of the placement machine having its associated optics oriented so as to look up at the bottom surface or a side of the component and thereby determine its X, Y and T orientation. Such systems also usually have a camera mounted with the pick-up head on the Z/T stage that can image the substrate from the pick-up head and determine its relative location. Such machine vision systems are commercially available and are all well within the skill of those having ordinary skill in the art.

Figure 4:
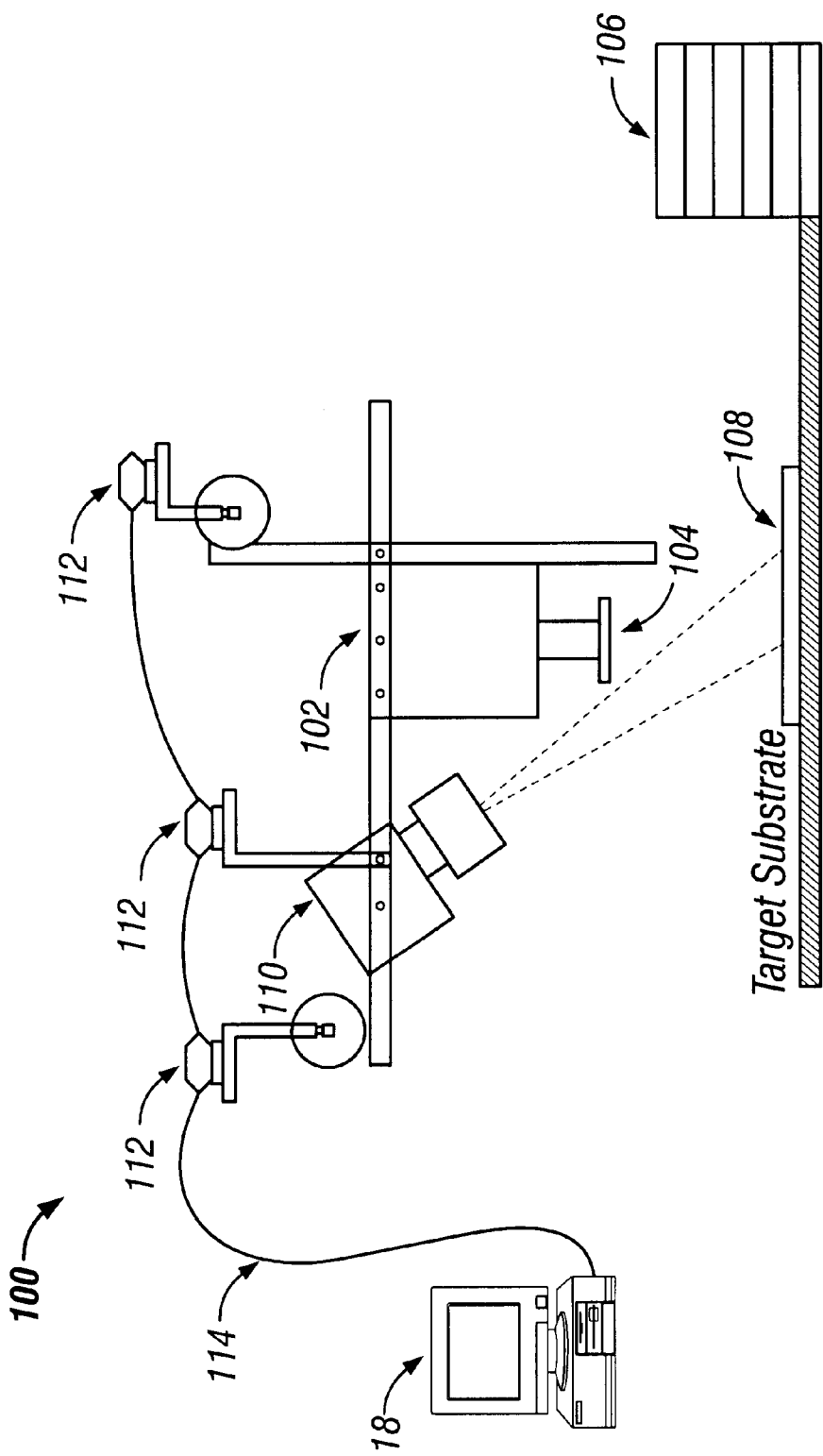
FIG. 4 is an elevational schematic diagram of a placement machine application for a semiautomatic method for digital feature separation in accordance with a specific embodiment of the present invention.

The present invention is represented in a specific embodiment by an algorithm which performs digital feature filtering most typically in a placement machine application as is illustrated in FIG. 4. However, the method of the present invention is not limited to such an application and can be used on any computer, application specific integrated circuit and the like. The placement machine 100 of FIG. 4 has a pick-up head 102 transportable in X, Y, Z and T (rotational) directions which picks up components 104 (with a vacuum pick-up, gripper pick-up, or similar device) from component feeders or component stores 106 and transports them for placement onto a selected location of a target substrate 108 such as a PCB. The components 104 in accordance with this example are typically electrical, electro-mechanical or electro-optic components and require highly accurate placement onto the target substrate 108 due to typically densely packed input/output (I/O) connections. Placement machine 100 generally has an imaging system 110 of some kind which observes the components 104 and the target substrate 108 in order to measure, register and align under-side contact and edge features of the components to corresponding target substrate features in order to achieve accurate placement. Placement machine 100 usually includes a number of motion control devices 112 for driving motors (also referred to as actuators) and sending and receiving digital and analog data. In addition, peripherals of placement machine 100 such as the imaging system 110, camera lighting (not shown), pick-up head 102 and vacuum generators (for use with vacuum pick-ups) may be wired to specific data input/output lines on the motion control devices 112.

The digital feature separation method as applied to the placement machine 100 example of FIG. 4 permits a user to view component 104 and target substrate 108 images gathered by an imaging system 110 on a host computer 18 in order to sample features of interest from the stored digital images such as pads, bumps or leads using a software "eye dropper" tool or a similar region-of-interest sampling tool commonly available in the art. By comparing the sampled features with a newly acquired or live digital image having corresponding features of interest such as that of a target substrate 108, the digital feature separation method of the present invention permits a user to manually align the saved features from the component image over the corresponding features of the live image of the substrate to achieve component to substrate registration.

Figure 5:
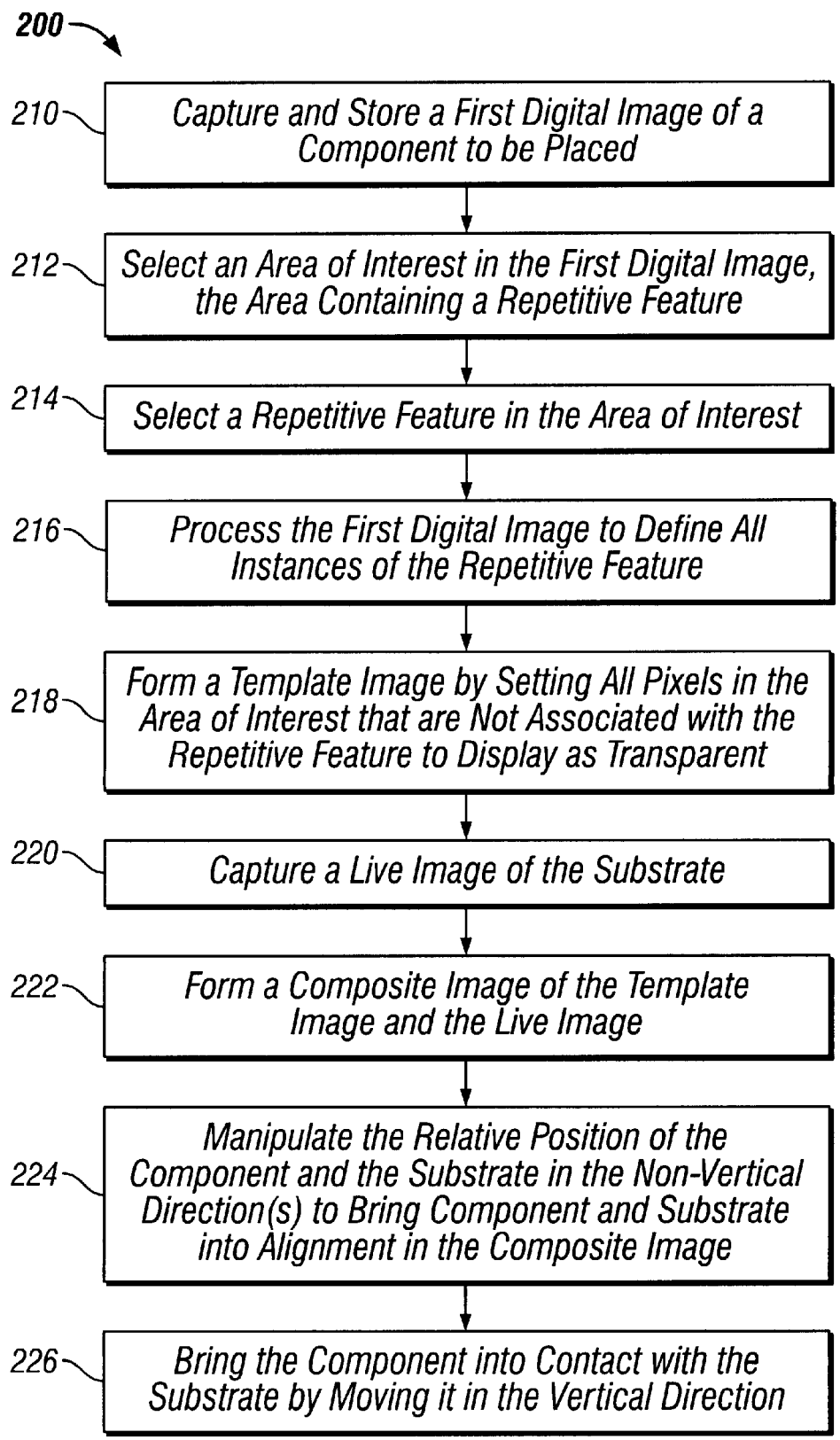
FIG. 5 is a process flow diagram of a method in accordance with a specific embodiment of the present invention.

The method of the present invention provides a semiautomatic process for separating and distinguishing features from digitally stored images. A specific embodiment of the method 200 as illustrated in FIG. 5 begins at block 210 with capturing and storing a first digital image of the actual component to be placed or of a model component. The component is typically an electronic or electro-mechanical component with repetitive contact and alignment features such as pads, bumps or leads of a certain pitch which the user wants to register and align with corresponding features of the same pitch (such as contact pads) on a target substrate. At block 212 the user selects and samples an area of interest in the first digital image, the area of interest containing a repetitive feature. For example, the user might select all contact bumps or a SUBSET THEREOF. The features are sampled using a conventional software tool such as an "eye dropper" tool or a similar region-of-interest tool. The region-of-interest tool may use a conventional sampling method to select an area of interest of defined pixel size containing a subset of adjacent pixels. The group of pixels sampled can, for example, be represented by a circle of fixed radius where all pixels with coordinates falling inside the circle are selected. At block 214 a repetitive feature (such as a bump, pad or lead) is selected.

The sample pixels representing features of interest are analyzed and processed at block 216 based on their color characteristics, including their intensity (for gray scale images) hue and saturation (for color images). The method calculates statistics on intensity or hue and/or saturation values for all pixels in the selected area. A histogram distribution of all pixels in the selected area is then calculated based on their intensity or hue and/or saturation values to define all instances of the repetitive feature in the selected area.

In accordance with another specific embodiment of the invention, the histogram may be used as a template for comparison to additionally acquired or live digital images whereby matching features may be automatically selected. In accordance with this approach, the automatic selection of desired features from another live digital image or newly acquired digital image is made by using cut-off filtering criteria. A standard deviation is calculated for all the originally sampled pixels from the histogram template, and this statistic can be used as a cut-off filter criteria for selecting all features in the newly acquired digital image. Additional statistical filters are then used to eliminate noise, one of which applies a size filter which only includes those pixels that are adjacent to one another in minimum groups of at least some minimum specified number (i.e. a minimum area criteria). Shape criteria such as minimum bounding box size, concentricity, or minimum/maximum radius can also be applied to the selected pixels so that only genuine features of known shape and size are selected as desired features from the newly acquired digital image.

When a new picture is taken, the image is first histogramed and its mean intensity determined. All new pixel intensity values are then normalized to the mean intensity values of the originally sampled pixels from the histogram template before the feature selection process begins. After intensity normalization, all pixels from the newly acquired picture which fall within the specified cut-off filtering criteria standard are selected. The locations and values of the selected pixels from the new image are saved.

Using either approach at block 218, background or surrounding element pixels from the processed digital image which are not associated with the selected repetitive feature in the related area of interest are deleted and replaced with a code that makes them appear as a graphic transparency. This process leaves a template image having only the repetitive features of interest disposed in their original locations. All other pixels are made video transparent. The resulting template image which contains only the selected features is then laid over a live image (captured at block 220) such as that of a target substrate to form a composite image (222) with corresponding features of interest. The operator then manually aligns 224 the saved features from the component image over the corresponding features of the live image in the X, Y, and T (rotational) directions. Once sufficiently aligned in X, Y, and T, the operator brings the component into physical contact 226 with the target substrate to achieve component to substrate registration by moving the component in the Z dimension.

Figure 6:
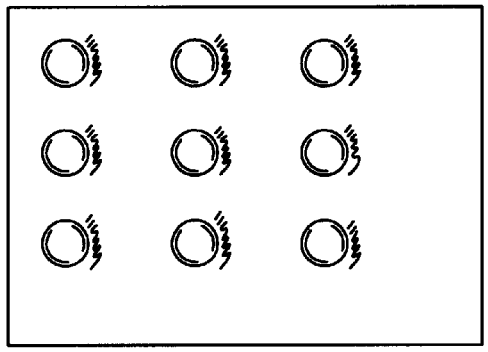
FIG. 6 is an illustration of a video image of a component.

FIG. 6 is an illustration of a video image of a component.

Figure 7:
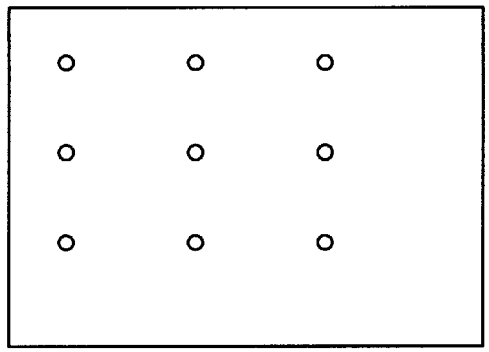
FIG. 7 is an illustration of a template image of a component in accordance with a specific embodiment of the present invention.

FIG. 7 is an illustration of a template image of a component in accordance with a specific embodiment of the present invention.

Figure 8:
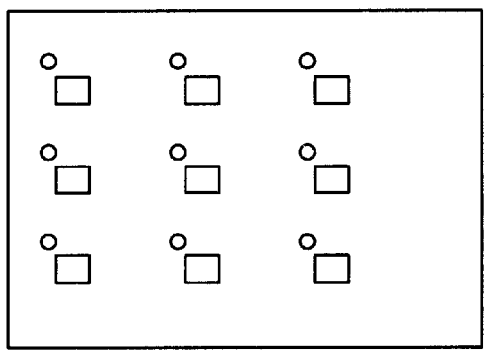
FIG. 8 is an illustration of a composite image formed from a template image and a line substrate image showing the component and the substrate in misregistration in accordance with a specific embodiment of the present invention.

FIG. 8 is an illustration of a composite image formed from a template image and a line substrate image showing the component and the substrate in misregistration in accordance with a specific embodiment of the present invention.

Figure 9:
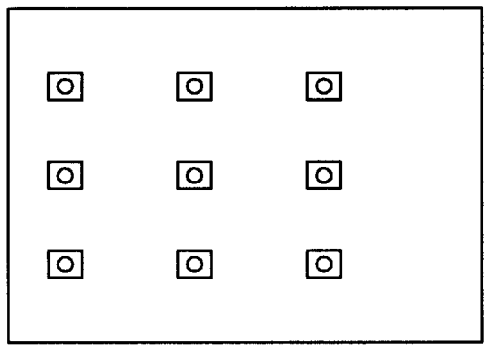
FIG. 9 is an illustration of a composite image formed from a template image and a line substrate image showing the component and the substrate in registration in accordance with a specific embodiment of the present invention.

FIG. 9 is an illustration of a composite image formed from a template image and a line substrate image showing the component and the substrate in registration in accordance with a specific embodiment of the present invention.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for placing a component on a selected location of a substrate with a placement machine including at least an X-motion stage and a Z-motion stage including a pick-up head for carrying the component to the selected location on the substrate, said method comprising:

capturing a first digital image of the bottom of the component;

selecting a region of interest in the first digital image;

selecting a repetitive feature contained within the region of interest;

creating a template image showing the repetitive feature with background matter rendered transparent;

capturing a live image of the selected location of the substrate;

overlaying the live image and the template image to form a composite image on a video display;

manipulating the relative position in non-vertical directions of the component and the substrate until the repetitive feature is brought into alignment with corresponding repetitive features in the composite image; and bringing the component into contact with the substrate by moving it in the vertical direction.

2. A method in accordance with claim 1 wherein said first digital image is a gray scale image and said creating includes analyzing said repetitive feature for intensity over a spatial range and identifying all similar repetitive features within the region of interest and rendering all other material in the template image transparent.

3. A method in accordance with claim 1 wherein said first digital image is a color image and said creating includes analyzing said repetitive feature for hue and saturation over a spatial range and identifying all similar repetitive features within the region of interest and rendering all other material in the template image transparent.

4. A method for placing a component on a selected location of a substrate with a placement machine including an X-Y motion stage and a Z-motion stage having a pick-up head for carrying the component to the selected location on the substrate, the pick-up head being carried by the X-Y motion stage, said method comprising:

capturing a first digital image of the bottom of the component;

selecting a region of interest in the first digital image;

selecting a repetitive feature contained within the region of interest;

creating a template image showing the repetitive feature with background matter rendered transparent;

capturing a live image of the selected location of the substrate;

overlaying the live image and the template image to form a composite image on a video display;

manipulating the relative position in non-vertical directions of the component and the substrate until the repetitive feature is brought into alignment with corresponding repetitive features in the composite image; and bringing the component into contact with the substrate by moving it in the vertical direction.

5. A method in accordance with claim 4 wherein said first digital image is a gray scale image and said creating includes analyzing said repetitive feature for intensity over a spatial range and identifying all similar repetitive features within the region of interest and rendering all other material in the template image transparent.

6. A method in accordance with claim 4 wherein said first digital image is a color image and said creating includes analyzing said repetitive feature for hue and saturation over a spatial range and identifying all similar repetitive features within the region of interest and rendering all other material in the template image transparent.

7. An apparatus for placing a component on a selected location of a substrate including a placement machine having at least an X-motion stage and a Z-motion stage with a pick-up head for carrying the component to the selected location on the substrate, said apparatus comprising:

means for capturing a first digital image of the bottom of the component;

means for selecting a region of interest in the first digital image;

means for selecting a repetitive feature contained within the region of interest;

means for creating a template image showing the repetitive feature with background matter rendered transparent;

means for capturing a live image of the selected location of the substrate;

means for overlaying the live image and the template image to form a composite image on a video display;

means for manipulating the relative position in non-vertical directions of the component and the substrate until the repetitive feature is brought into alignment with corresponding repetitive features in the composite image; and means for bringing the component into contact with the substrate by moving it in the vertical direction.

8. An apparatus in accordance with claim 7 wherein said first digital image is a gray scale image and said means for creating includes means for analyzing said repetitive feature for intensity over a spatial range and means for identifying all similar repetitive features within the region of interest and rendering all other material in the template image transparent.

9. An apparatus in accordance with claim 7 wherein said first digital image is a color image and said means for creating includes means for analyzing said repetitive feature for hue and saturation over a spatial range and means for identifying all similar repetitive features within the region of interest and rendering all other material in the template image transparent.

10. An apparatus for placing a component on a selected location of a substrate including a placement machine having an X-Y motion stage and a Z-motion stage with a pick-up head for carrying the component to the selected location on the substrate, the pick-up head being carried by the X-Y motion stage, said apparatus comprising:

means for capturing a first digital image of the bottom of the component;

means for selecting a region of interest in the first digital image;

means for selecting a repetitive feature contained within the region of interest;

means for creating a template image showing the repetitive feature with background matter rendered transparent;

means for capturing a live image of the selected location of the substrate;

means for overlaying the live image and the template image to form a composite image on a video display;

means for manipulating the relative position in non-vertical directions of the component and the substrate until the repetitive feature is brought into alignment with corresponding repetitive features in the composite image; and means for bringing the component into contact with the substrate by moving it in the vertical direction.

11. An apparatus in accordance with claim 10 wherein said first digital image is a gray scale image and said means for creating includes means for analyzing said repetitive feature for intensity over a spatial range and means for identifying all similar repetitive features within the region of interest and rendering all other material in the template image transparent.

12. An apparatus in accordance with claim 10 wherein said first digital image is a color image and said means for creating includes means for analyzing said repetitive feature for hue and saturation over a spatial range and means for identifying all similar repetitive features within the region of interest and rendering all other material in the template image transparent.

* * * * *

UNITED STATES PATENT AND TRADEMARK OFFICE
CERTIFICATE OF CORRECTION

PATENT NO.   : 6,557,251 B2
DATED        : May 6, 2003
INVENTOR(S)  : Edison T. Hudson It is certified that error appears in the above-identified patent and that said Letters Patent is hereby corrected as shown below:

Title page,
Item [54], Title, replace "DIGITAL FEATURE SEPARATION" with -- METHOD AND APPARATUS FOR PLACING A COMPONENT ON A SUBSTRATE --.

Column 5,
Line 39, replace "SUBSET THEREOF." with -- subset thereof. --.

Column 7,
Line 16, replace "it" with -- the component --.
Line 16, replace "the" with -- a --.
Line 52, replace "it" with -- the component --.
Line 52, replace "the" with -- a --.

Column 8,
Line 23, replace "it" with -- the component --.
Line 23, replace "the" with -- a --.
Line 63, replace "it" with -- the component --.
Line 63, replace "the" with -- a --.

Signed and Sealed this

Twenty-first Day of October, 2003

JAMES E. ROGAN
*Director of the United States Patent and Trademark Office*